United States Patent
Alouini et al.

(10) Patent No.: US 10,566,759 B2
(45) Date of Patent: Feb. 18, 2020

(54) SPECTRAL NARROWING MODULE, REFINED SPECTRAL LINE DEVICE AND METHOD THEREFOR

(71) Applicants: UNIVERSITE DE RENNES 1, Rennes (FR); CENTRE NATIONAL DE LA RECHERCHE SCIENTIFIQUE, Paris (FR)

(72) Inventors: Mehdi Alouini, Les Landelles (FR); Gwennaël Danion, Le Rheu (FR); Marc Vallet, Thorigne Fouillard (FR)

(73) Assignees: UNIVERSITE DE RENNES 1, Rennes (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/309,346

(22) PCT Filed: Jun. 12, 2017

(86) PCT No.: PCT/FR2017/051491
§ 371 (c)(1),
(2) Date: Dec. 12, 2018

(87) PCT Pub. No.: WO2017/216459
PCT Pub. Date: Dec. 21, 2017

(65) Prior Publication Data
US 2019/0312405 A1    Oct. 10, 2019

(30) Foreign Application Priority Data
Jun. 13, 2016    (FR) ..................... 16 55456

(51) Int. Cl.
*H01S 3/30* (2006.01)
*H01S 3/00* (2006.01)
(Continued)

(52) U.S. Cl.
CPC ........... *H01S 3/302* (2013.01); *H01S 3/0085* (2013.01); *H01S 3/106* (2013.01);
(Continued)

(58) Field of Classification Search
CPC ........ H01S 3/302; H01S 3/106; H01S 3/0085; H01S 2302/02
See application file for complete search history.

(56) References Cited

U.S. PATENT DOCUMENTS

2011/0134940 A1    6/2011 Hartog

FOREIGN PATENT DOCUMENTS

WO    2008047329 A2    4/2008

OTHER PUBLICATIONS

Castro M. et al.; "Self-injection locking of DFB laser diode with Brillouin amplification in optical fibre feedback", Electronic Letters, IEE Stevenage, GB, vol. 43, No. 15. Jul. 19, 2007, pp. 802-804.
(Continued)

*Primary Examiner* — Xinning(Tom) Niu
(74) *Attorney, Agent, or Firm* — Cantor Colburn LLP

(57) ABSTRACT

Many applications require the use of lasers with short optical ray lengths. However, at present, there is no module that makes it possible to refine a ray from a light source in a satisfactory manner, in particular one from a semiconductor laser. The invention relates to a spectral refinement method (500), a device with refined spectral line (200) comprising at least one light source (210) and a spectral refinement module (100). The latter includes at least one first coupler (111), a Brillouin resonator (120) and a modulator (130).

20 Claims, 7 Drawing Sheets

(51) Int. Cl.
H01S 3/106 (2006.01)
H01S 5/065 (2006.01)
H01S 3/10 (2006.01)

(52) U.S. Cl.
CPC ........ *H01S 3/10092* (2013.01); *H01S 5/0656* (2013.01); *H01S 2302/02* (2013.01)

(56) References Cited

OTHER PUBLICATIONS

International Search Report for Application No. PCT/FR2017/051491.
Thevenaz L et al.: "Novel schemes for optical signal generation using laser injection locking with application to Brillouin sensing; Novel schemes for optical signal generation using laser injection locking with application to Brillouin sensing", Measurement Science and Technology, IOP, Bristol, GB vol. 15, No. 8 (Aug. 1, 2004).
Written Opinion for Application No. PCT/FR2017/051491.

SPECTRAL NARROWING MODULE, REFINED SPECTRAL LINE DEVICE AND METHOD THEREFOR

CROSS REFERENCE TO RELATED APPLICATIONS

This application is a National Stage of PCT Application No. PCT/FR2017/051491 filed on Jun. 12, 2017, which claims priority to French Patent Application No. 16/55456 filed on Jun. 13, 2016 the contents each of which are incorporated herein by reference thereto.

FIELD OF THE INVENTION

The field of the present invention concerns the one of the light sources producing an amplified light beam by stimulated emission of radiation. It particularly, but not exclusively, concerns the field of the spectral narrowing modules. More specifically, the present invention concerns the methods for spectrally refining a light source by introducing a previously spectrally refined light beam.

PRIOR ART

Nowadays, many applications require the use of a light source having small optical linewidths. These applications are generally optical metrology, spectroscopy, telecommunications, radar systems, atom manipulation and atomic clocks. Nevertheless, the light sources currently on the market comprise a significant linewidth. Of course, there are light sources having a small linewidth, however they have the drawback of being often complex, with low power, not very tunable and especially expensive. Moreover, this present invention differs from the techniques of the state of the art, in that it is not a conventional master-slave injection which necessarily requires two different sources: a master source, a slave source.

DISCLOSURE OF THE INVENTION

The present invention aims at solving all or part of the above-mentioned drawbacks in the form of a spectral narrowing module for at least one first light source, the spectral narrowing module comprising:
  at least one first coupler; said at least one first coupler is configured to derive at least one first pumping light beam from one first incident light beam originating from said at least one first light source and introduced into the spectral narrowing module;
  a Brillouin resonator; the Brillouin resonator is configured to generate, from at least one portion of said first pumping light beam, at least one first resonant light beam; and
  a modulator; the modulator is configured to generate, from the first resonant light beam, at least one first modulated light beam;
  the spectral narrowing module is configured to totally or partially introduce the first modulated light beam into said at least one first coupler, said at least one first coupler is configured to totally or partially introduce the first modulated light beam into said at least one first light source so as to narrow the spectral line of said at least one first light source.

The advantages of this invention are numerous. The spectral line narrowing module is applicable to any light source and this of any wavelength. Preferably, the narrowing module according to the invention may be used for «distributed feedback» lasers, better known as DFB lasers, often used for applications in the telecommunication field which have a poor spectral quality but which are extremely inexpensive, very compact and energy-efficient. The semiconductor light sources also have the advantage of covering a wavelength range from blue to infrared, such as for example from 400 nm to 12 µm. The compatibility of the invention with this type of light source and in particular with this type of laser is a significant progress as it provides a very simple and inexpensive solution to a large number of applications such as cesium or rubidium clocks, which require spectrally very fine lasers oscillating at extremely accurate frequencies in the very-near infrared. The use of a DFB-type compact semiconductor laser and fiber technologies makes the invention compatible with hostile environments including the airborne and space environment.

In summary, the invention offers simultaneously a small linewidth, a great tunability, an extremely wide operating wavelength range, a good compactness, an excellent robustness, a compatibility with platforms in severe environment, a low weight, a moderate energy consumption and a low cost.

The spectral narrowing module may further have one or more of the following characteristics, taken alone or in combination.

According to a non-limiting embodiment, said at least one first coupler is configured to totally or partially introduce the first modulated light beam into said at least one first light source so as to impart the fineness line of the modulated light thereto.

According to a non-limiting embodiment, the modulator is configured to generate, from the first resonant light beam, at least one first modulated light beam of which at least one of the spectral components is distant by at most 50 GHz from the spectral component of said at least one first light source.

Advantageously, thanks to this arrangement, the spectral narrowing module generates a first signal light beam having a small spectral linewidth which can be used for different purposes.

According to a non-limiting embodiment, said at least one first coupler is configured to derive a first signal light beam from the first incident light beam originating from said at least one first light source and introduced into the spectral narrowing module.

Advantageously, thanks to this arrangement, the spectral narrowing module generates a first signal light beam having a small spectral linewidth which can be used for different purposes.

According to a non-limiting embodiment:
  said at least one first coupler is configured to derive at least one second pumping light beam from a second incident light beam originating from a second light source and introduced into the spectral narrowing module;
  the Brillouin resonator is configured to generate, from at least one portion of the second pumping light beam, a second resonant light beam; and
  the modulator is configured to generate, from the second resonant light beam, at least one second modulated light beam,
  the spectral narrowing module is configured to totally or partially introduce the second modulated light beam into said at least one first coupler, said at least one first coupler is configured to totally or partially introduce the second modulated light beam into the second light source so as to narrow the spectral line of the second light source.

Advantageously, thanks to this arrangement, the spectral narrowing module generates a second refined light beam from the second light source, possibly using the first light source, having spectral characteristics different from the first light source and having a small spectral linewidth which can be used for different purposes.

According to a non-limiting embodiment, the modulator is configured to generate, from the second resonant light beam, at least one second modulated light beam of which at least one of the spectral components is distant by at most 50 GHz from the spectral component of the second light source.

Advantageously, thanks to this arrangement, the modulator generates, from the second resonant light beam, at least one second modulated light beam of which at least one of the spectral components is close to the spectral component of the second light source.

According to a non-limiting embodiment, said at least one first coupler is configured to derive a second signal light beam from the second incident light beam originating from the second light source and introduced into the spectral narrowing module.

Advantageously, thanks to this arrangement, the spectral narrowing module generates a second signal light beam from the second light source having spectral characteristics different from the first light source and having a small spectral linewidth which can be used for different purposes.

According to a non-limiting embodiment, the modulator is configured to generate, from the first resonant light beam, a second modulated light beam capable of refining the spectral line of a second light source.

According to a non-limiting embodiment, the second modulated light beam comprises at least one spectral component capable of refining the spectral line of a second light source.

According to a non-limiting embodiment, the second modulated light beam comprises a spectral component configured to narrow the spectral line of a second light source.

Advantageously, thanks to this arrangement, the spectral narrowing module generates a second refined light beam, from the first light source, having spectral characteristics different from the first light source and having a small spectral linewidth which can be used for different purposes.

According to a non-limiting embodiment, the spectral narrowing module comprises a second coupler; the second coupler is configured to totally or partially introduce the second modulated light beam originating from the modulator into the second light source so as to narrow the spectral line of the second light source.

Advantageously, thanks to this arrangement, the spectral narrowing module generates a second refined light beam having a small spectral linewidth which can be used for different purposes.

According to a non-limiting embodiment, the second coupler is configured to derive at least one second signal light beam from the second incident light beam originating from the second light source and introduced into the spectral narrowing module.

Advantageously, thanks to this arrangement, the spectral narrowing module generates a second signal light beam having a small linewidth.

According to a non-limiting embodiment, the spectral narrowing module comprises a third coupler configured to generate, from at least one signal light beam among the first signal light beam originating from said at least one first coupler and the second signal light beam originating from the second coupler, a third signal light beam.

Advantageously, thanks to this arrangement, the spectral narrowing module generates a third signal light beam comprising at least one small spectral linewidth among the first signal light beam and the second signal light beam.

According to a non-limiting embodiment, the third signal light beam, totally or partially comprises at least one signal light beam among the first signal light beam of said at least one first light source and the second signal light beam of the second light source, the third signal light beam is generated by at least one coupler among said at least one first coupler and the third coupler.

According to a non-limiting embodiment, the spectral narrowing module is configured to introduce the first modulated light beam into the second coupler so as to be totally or partially introduced into the second light source and so as to narrow the spectral line of the second light source.

Advantageously, thanks to this arrangement, only a portion of the power of the first light source is used to narrow the spectral line of the second light source without using part of its power.

According to a non-limiting embodiment, the spectral narrowing module is configured to introduce the second modulated light beam into said at least one first coupler so as to be totally or partially introduced into the first light source and so as to narrow the spectral line of the first light source.

Advantageously, thanks to this arrangement, only a portion of the power of the second light source is used to narrow the spectral line of the first light source without using part of its power.

According to a non-limiting embodiment, the first coupler is configured to derive at least one first signal light beam from the first incident light beam originating from said at least one first light source and introduced into the spectral narrowing module.

The present invention concerns a refined spectral line device, in which at least one light source among said at least one first light source and the second light source is characterized by the emission of at least one incident light beam among said at least one first incident light beam and the second incident light beam having totally or partially the spectral properties of at least one modulated light beam among said at least one first modulated light beam and the second modulated light beam, so as to allow the refined spectral line device to be self-sustained and produce at least one signal light beam among the first signal light beam and the second signal light beam having totally or partially the spectral properties of said at least one light beam among said at least one incident light beam and said at least one modulated light beam.

The present invention concerns a refined spectral line device comprising at least one spectral narrowing module according the invention and at least one first light source associated to said at least one spectral narrowing module.

The advantages of this invention are numerous. The refined spectral line device can use any light source and this of any wavelength. Preferably, the refined spectral line device according to the invention can use DFB lasers which have a poor spectral quality but which are extremely inexpensive, very compact and energy-efficient. Thus, the refined spectral line device allows covering a wavelength range from blue to infrared, such as for example from 400 nm to 12 µm. Due to its compatibility, the refined spectral line device provides a very simple and inexpensive solution to a large number of applications such as cesium or rubidium clocks, which require spectrally very fine lasers oscillating at extremely accurate frequencies in the very-near infrared. The use of a DFB-type compact semiconductor laser and of fiber technologies makes the invention compatible with hostile environments including the airborne and space environment.

According to a non-limiting embodiment, the refined spectral line device is configured to emit the first signal light beam or the third signal light beam.

The present invention concerns a spectral narrowing method for at least one first light source emitting a first incident light beam, the spectral narrowing method comprising the steps of:

- deriving the first incident light beam originating from said at least one first light source so as to generate a first light beam called first pumping light beam;
- resonating at least one portion of said first light beam called first pumping light beam so as to generate a first resonant light beam;
- modulating at least one portion of the light beam called first resonant light beam so as to generate at least one first modulated light beam; and
- totally or partially introducing said at least one first modulated light beam into said at least one first light source so as to narrow the spectral line of said at least one first light source.

The spectral narrowing method may further have one or more of the following characteristics, taken alone or in combination.

According to a non-limiting embodiment, during the modulation step, at least one portion of the first resonant light beam is modulated so as to generate a second modulated light beam.

According to a non-limiting embodiment, during the modulation step, at least one portion of the first resonant light beam is modulated so as to generate at least one first modulated light beam of which at least one of the spectral components is distant by at most 50 GHz from the spectral component of said at least one first light source.

Advantageously, thanks to this arrangement, the modulation step generates, from the second resonant light beam, at least one second modulated light beam of which at least one of the spectral components is close to the spectral component of the second light source.

According to a non-limiting embodiment, during the introduction step, the second modulated light beam is totally or partially introduced into a second light source so as to narrow the spectral line of the second light source.

According to a non-limiting embodiment, the spectral narrowing method uses the spectral narrowing module according to the invention or the refined spectral line device according to the invention.

Other characteristics and advantages of the invention will become more apparent upon reading the following description of an embodiment of the invention given by way of a non-limiting example.

LIST OF FIGURES

The invention will be better understood using the detailed description which is disclosed hereinbelow in relation to the drawings, wherein.

Figure 16:
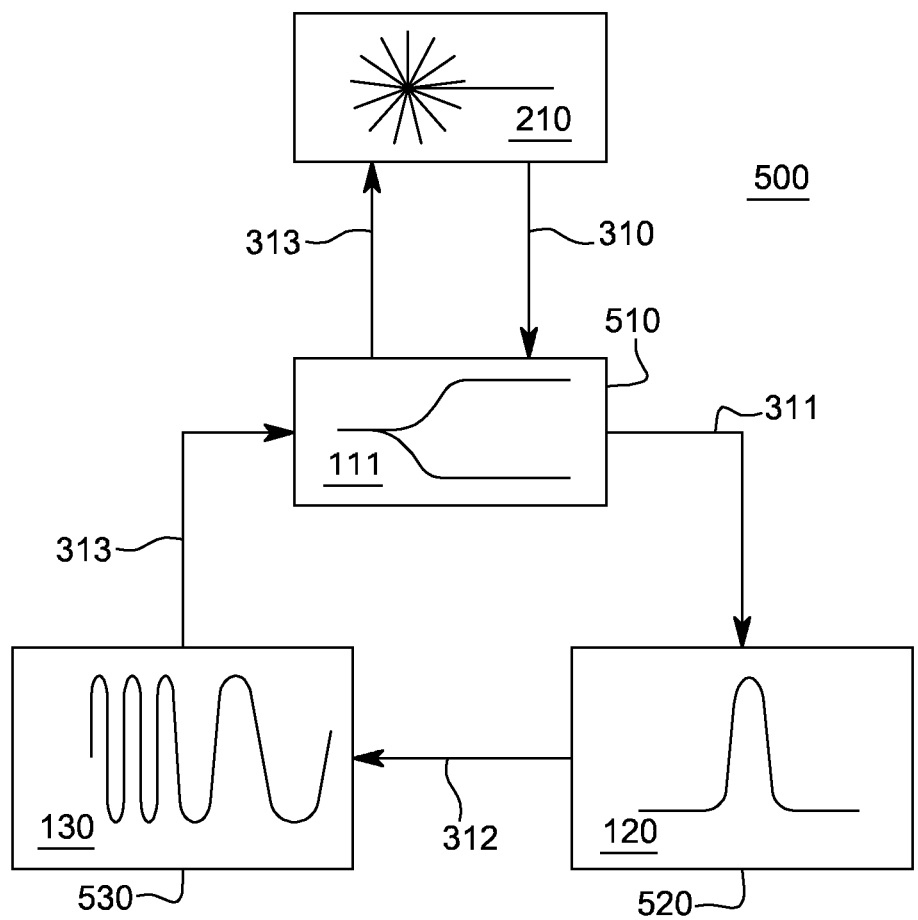
Figure 17:
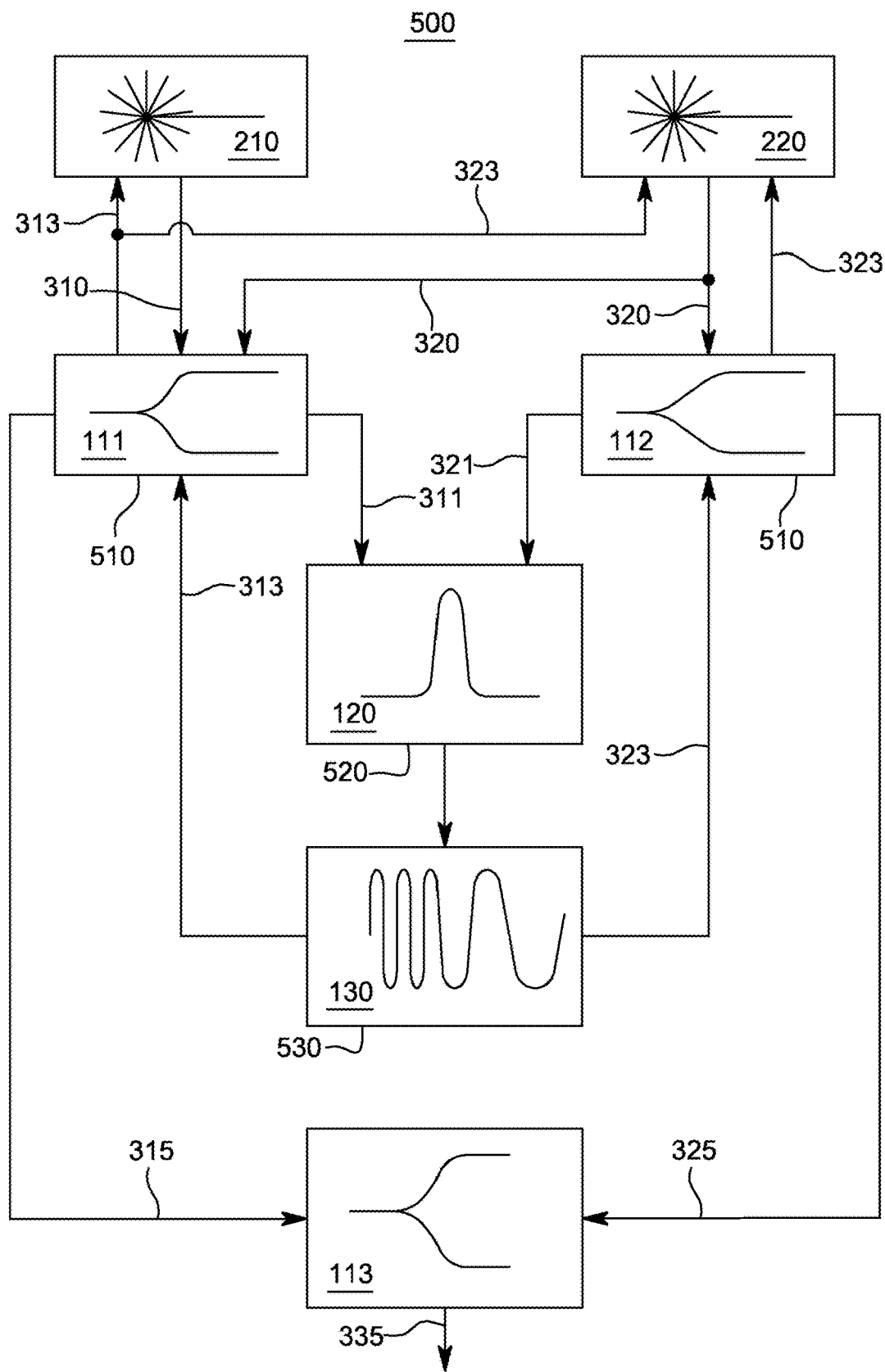

FIG. 16 illustrates the general principle of the spectral narrowing method 500 for at least one first light source 210 according to the first embodiment; and FIG. 17 shows the steps of the spectral narrowing method 500 for at least two light sources according to the second and third embodiments.

In the following detailed description of the figures defined above, the same members or the members fulfilling identical functions might keep the same references so as to simplify the understanding of the invention.

GENERAL DESCRIPTION OF THE INVENTION

General Principle

The invention relates to the joint use of a resonator 120, in particular a Brillouin resonator 120 and a modulator 130 in order to narrow the spectral line of at least one light source. Part of the power of said at least one first light source is sampled by said at least one first coupler in order to be used as a useful signal wave. The other part of the power is used to pump the Brillouin resonator 120 which will allow refining the laser line.

The resonator 120, and in particular the Brillouin resonator 120, is configured to be pumped using said at least one light source 210. The term «pumping» is well known to those skilled in the art. The wave called pump wave 311 (at the frequency $v_p$) will interact with the acoustic waves present in the considered medium. This interaction corresponds to the inelastic diffusion of the wave called pump wave on the index network induced by acoustic waves, resulting in the generation by Brillouin effect of a light wave, called Stokes wave 312 (at the frequency $v_s$). The beat thereof with the pump wave 311 will create an intensity modulation and an index grating which propagate at the velocity $C_a$, which will tend to amplify the resulting acoustic wave. The acoustic wave thus created scatters more the pump wave, which reinforces the Stokes wave. And so on, both processes reinforce each other and cause an amplification of the Stokes wave.

The resonator 120 is also configured to be resonant for the Stokes wave 312 generated by Brillouin effect, and therefore the Stokes wave 312 can be qualified as a Brillouin wave 312, of a wavelength $v_b$, and is ideally non-resonant for the wavelength of said at least one first light source, or more exactly for the pumping wavelength $v_p$.

The phenomenon of optical resonance consists in circulating, over several revolutions, the light wave in an optical resonator. This mechanism imparts to the wave coming from the resonator an increased line fineness. When the optical resonator has a gain (herein obtained by the pump through the Brillouin effect), the wave generated (herein Stokes Waves) has a linewidth inversely proportional to the length of the resonator and to the number of performed revolutions, and to the light power of this wave.

The wavelength of said at least one first light source does not play a role for the Brillouin effect contrary to a gas laser for example. Indeed, this is why the present invention operates at any wavelength.

Thus, part of the beam of this light source is used to pump the Brillouin resonator 120. The Stokes wave 312, that is to say the resonant light beam, coming from the Brillouin resonator 120 is naturally shifted from one to a maximum of about fifty Gigahertz with respect to the emission wavelength of said at least one first light source, in other words, of the pumping light beam and by extension of the incident light beam. The resonator 120 is generally non-resonant for said at least one first light source so as to allow an optimal operation at any frequency of said at least one first light source. The produced Brillouin wave 312, or Stokes wave 312, is resonant.

Said at least one first coupler 111 allows extracting part of the incident light beam 310 and directing the pump wave 311 towards the resonator 120. The Brillouin wave 312 is directed towards a modulator 130. These two waves, that is to say the pumping light beam called pump wave and the resonant light beam called Brillouin wave 312, are frequency-shifted from each other. The resonator 120 is preferably a fiber resonator so as to have a simplified and very easy integration and whose cost is low and space-requirement very small since the fiber may be wound around a coil. Of course, other resonator architectures may be considered, because the Brillouin effect may be obtained in other materials, gas or liquid.

Once pumped, the Brillouin resonator 120 behaves like a light source which oscillates at the frequency of the Stokes wave 312.

According to the embodiments, the modulator 130 can be a Mach-Zehnder type intensity modulator, a phase modulator, a single sideband modulator, an acousto-optic modulator, or a light modulator followed by any optical non-linear effect. The modulator 130 modulates the resonant light beam called Brillouin wave 312 at the shift frequency in order to reveal at least one optical line of the same frequency or close to 20 GHz as the laser source 210. This line is then introduced into the laser source 210 by means of said at least one first coupler 111. The introduction of the modulated Stokes wave 313 allows spectrally refining said at least one first light source 210.

The operation of a modulator is known to those skilled in the art and does not require to be shown. Indeed, this device 130 produces a variation as a function of time at the frequency called modulation frequency of one of the magnitudes characterizing the periodic light oscillation named carrier oscillation. This variation leads to the generation of at least one optical line shifted from the modulation frequency. In other words, an optical modulator 130 is an optoelectronic component generally controlled by an electrical signal, which provides a modulated optical signal, generally in intensity, when a continuous-time optical signal is applied to the input.

The Brillouin resonator 120 is composed of a fiber loop of several tens of meters. This loop is non-resonant at the frequency of the laser source 210. This characteristic is true regardless of the frequency of the laser source 210. The pump wave 311 is not resonant because the Brillouin resonator 120 is not resonant for the direction of propagation of the pump wave 311. The Brillouin resonator 120 is, however, resonant in the other direction, i.e., the direction of propagation of the Stokes wave 312.

The Brillouin wave 312 of a frequency $v_b$, generated in the opposite direction is, in turn, resonant. The Brillouin wave 312 of a frequency $v_b$ is extracted using an integrated coupler (not shown) into the Brillouin resonator 120, and then transmitted to said at least one first coupler 111.

The Brillouin wave 312 of a frequency $v_b$ is extracted by said at least one first coupler 111. The frequency deviation between the laser source 210 of a frequency $v_p$ and the Brillouin laser of a frequency $v_b$ depends on the characteristics of the Brillouin loop, on the properties of the fiber used in the Brillouin resonator 120 and on the emission wavelength of the laser source. The frequency of the Brillouin wave 312 is defined as:

$$v_b = v_p\left(1 - 2\frac{nc_a}{c}\right)$$

With $v_p$, the frequency of said at least one first light source 210, n the optical index of the fiber, c the celerity of light and $c_a$ the speed of the acoustic waves in the medium in which the frequency of said at least one first light source 210 propagates. The frequency wave $v_b$ coming from the Brillouin laser, more exactly from the Brillouin resonator 120, is then sent to a light modulator 130. The modulator 130 gives rise to lines on either side of the frequency of the incident wave of a frequency $v_b$ whose frequency deviation is given by $mf_{ol}$, $f_{ol}$ being the modulation frequency 530 and man integer. The frequency $f_{ol}$ is adjusted in order to correspond to the Brillouin shift frequency, namely $f_{ol}=\Delta v=(|v_p-v_b|)$. Thus, we generate a frequency $v'_p$ corresponding to the optical frequency of the laser source, which according to the applied modulation may correspond to a frequency different from that of $v_p$:

$$v'_p = v_b + f_{ol} = v_p$$

This generated wave of a frequency $v'_p = v_b + f_{ol}$ is then sent to the laser source 210. This generated wave of a frequency $v'_p$ has the same frequency as the laser source 210, however, the generated wave of a frequency $v'_p$ has been spectrally refined thanks to the Brillouin resonator 120. Its introduction into said at least one first light source 210 therefore narrows its spectral line itself. This mechanism is naturally self-sustained and allows stabilizing said at least one first light source 210. Indeed, once spectrally refined, the pump laser 210 has the optimal spectral properties to pump again the Brillouin resonator 120 and be further refined. Typically, the initial linewidth measured at −3 dB of the peak value or at half-height namely at 50% of the peak value and which can be of few Megahertz, see FIG. 1 curve 310, becomes in the range from a few tens to a few Hertz or even lower than one Hertz, see for example FIG. 1 curve 315, by this optical introduction method. It should be noted that the invention requires no electronic servo-control. The technique is therefore not limited by the bandwidth of the phase-locked loops.

The technique is therefore not limited by the bandwidth of an electronic counteraction, which makes it compatible with the spectral narrowing of wide lines such as those of the semiconductor lasers of the (Laser Diode, Fabry-Perot, quantum cascade lasers, VCSEL, with an extended external cavity, etc.) type or any other laser having a line too wide to be servo-controlled by electronic means such as for example solid lasers (Nd:YAG, Er:YAG, Er:Yb, etc.), box or quantum wire lasers, Raman lasers, fiber lasers, gas lasers, dye lasers, chemical lasers, free-electron lasers, LEDs and OLEDs.

It is possible to introduce into the laser a higher order harmonic created by the modulator 130 in order to reduce the modulation frequency 530 if necessary. It is possible to use an optical amplifier (not shown) if the optical power delivered by the laser source is not sufficient. Finally, the useful signal 315 may be the wave coming from the pump laser 210, as described herein, or the Stokes wave 312 coming from the Brillouin resonator 120.

Moreover, when the modulated light beam 313 is introduced into said at least one first light source 210, mode jumps of the Brillouin resonator 120 are avoided, which allows obtaining a time-stable Brillouin resonator 120.

Furthermore, as previously indicated, it is possible to have an amplifier so as not to be limited by the power of the Brillouin resonator.

The advantages of this invention are numerous. The technique is applicable to any type of light source, in particular to lasers, and to any wavelength. It is indeed possible to use semiconductor lasers which have a poor spectral quality but which are extremely inexpensive to produce very fine linewidths. The semiconductor lasers also have the advantage of covering a wavelength range from blue to infrared. The compatibility of the invention with this type of lasers is a significant progress as the invention provides a very simple and inexpensive solution to a large number of applications. The cesium or rubidium clocks, for example, require lasers which are spectrally very fine and oscillating at extremely accurate frequencies in the very-near infrared. The invention meets this type of need. The use of a compact semiconductor laser and fiber technologies makes the invention compatible with hostile environments including the aerospace and/or maritime environment.

In summary, the invention offers simultaneously a small linewidth, a great tunability, an extremely wide operating wavelength range, a good compactness, an excellent robustness, a compatibility with platforms in severe environment, a low weight, a moderate energy-consumption and a low cost.

General Description of a First Embodiment

Figure 2:
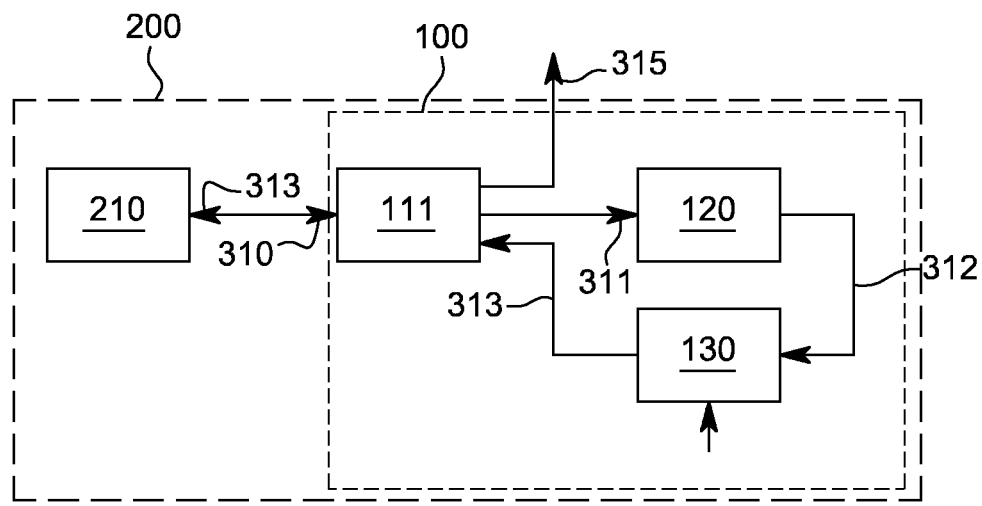
FIG. 2 shows an example of a refined spectral line device 200 and of a spectral narrowing module 100 in which the method according to the invention is implemented.

FIG. 2 shows a spectral narrowing module 100. The spectral narrowing module 100, for at least one first light source 210, comprising said at least one first coupler 111, a Brillouin resonator 120 and a modulator 130.

Figure 5:
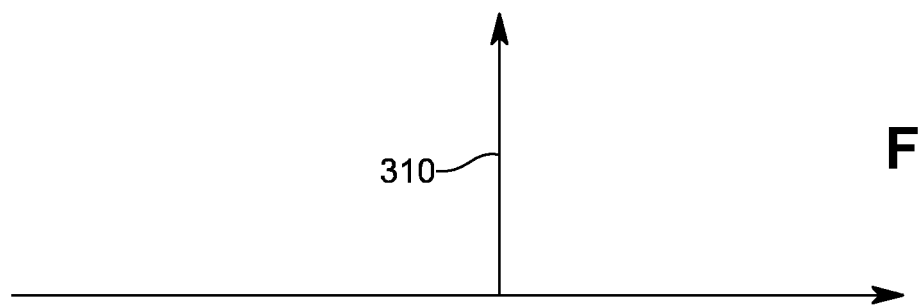
FIG. 5 shows an example of a spectral line of a light source according to a first embodiment.

The light source emits a first light beam as shown in FIG. 5. For reasons of simplification, only the peak of useful wavelength 315 will be shown in the graphs of the figures of the present application and/or of the present patent. The first said at least one first coupler 111 is configured to derive at least one first pumping light beam 311 from a first incident light beam 310 originating from said at least one first light source 210 and introduced into the spectral narrowing module 100. The first pumping light beam 311 is directed towards the Brillouin resonator 120.

Figure 6:
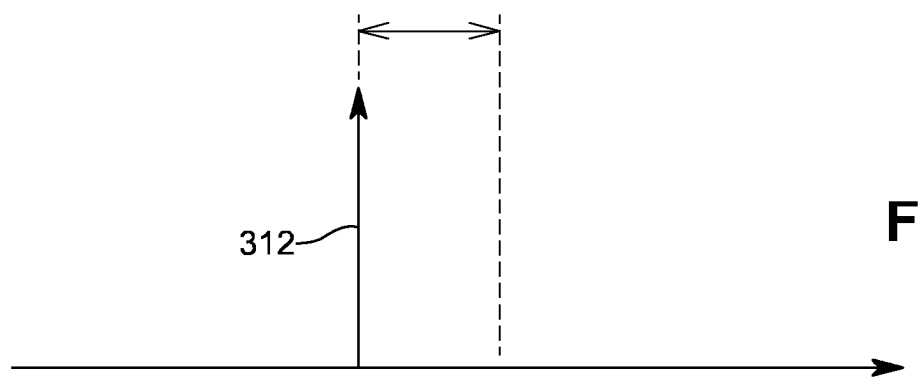
FIG. 6 shows an example of a resonant light beam according to a first embodiment.
Figure 7:
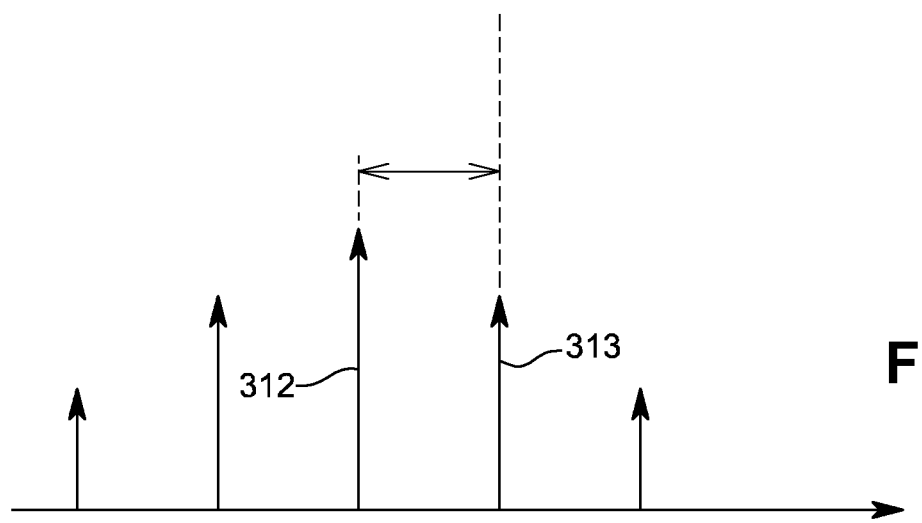
FIG. 7 shows an example of a modulated light beam according to a first embodiment.

This Brillouin resonator 120 is configured to generate, from at least one portion of said first pumping light beam 311, at least one first resonant light beam 312. The resonant light beam 312 is frequency-shifted from a few gigahertz to tens of gigahertz, as shown in FIG. 6. This first resonant light beam 312 is sent to the modulator 130.

The modulator 130 is configured to generate, from the first resonant light beam 312, at least one first modulated light beam 313. In practice, the modulated light beam 313 may be with one harmonic or with several harmonics. Thus, the first modulated light beam 313 is introduced via said at least one first coupler 111 into said at least one first light source 210 so as to narrow the spectral line of said at least one first light source 210.

The first said at least one first coupler 111 is configured to derive a first signal light beam 315 from the first incident light beam 310 originating from said at least one first light source 210 and introduced into the spectral narrowing module 100.

General Description of a Second Embodiment

Figure 3:
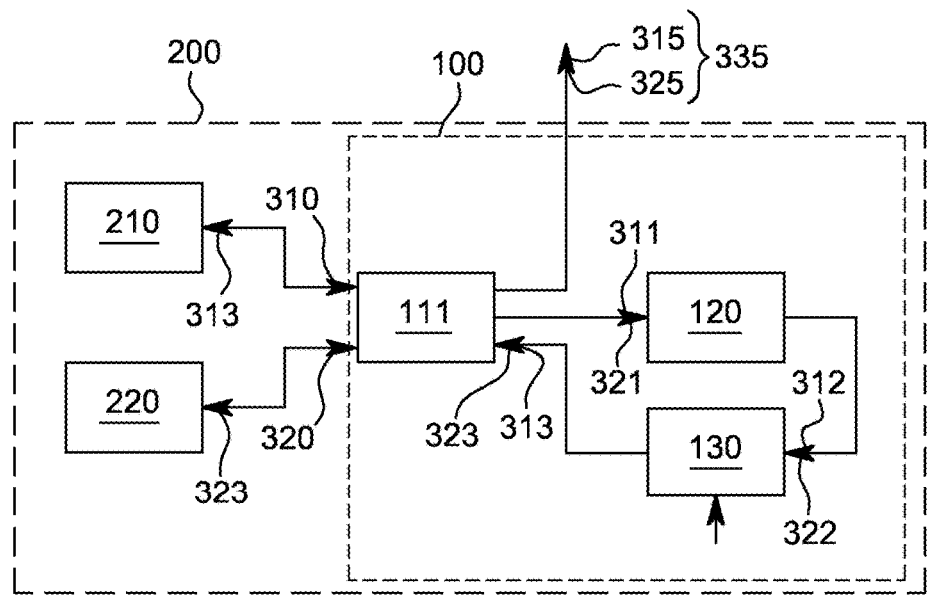
FIG. 3 illustrates an example of a refined spectral line device 200 and of a spectral narrowing module 100 comprising two light sources according to a non-limiting embodiment in which the method according to the invention is implemented.

The second embodiment shown in FIG. 3 is roughly similar to the first embodiment. Indeed, in addition to the first light source 210, the second embodiment comprises a second light source 220. The second light source 220 is transmitted to the first said at least one first coupler 111 via a medium such as glass, a gas, a crystal for example. The benefit of this arrangement is to narrow the two light sources, that is to say the first light source 210 and the second light source 220 or to narrow only the second light source 220 using the first light source 210.

Figure 8:
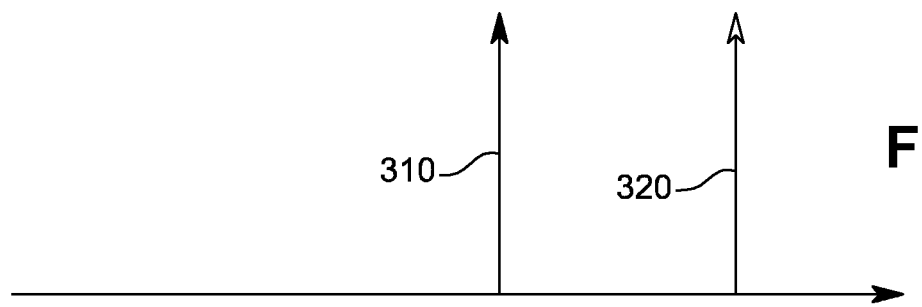
FIG. 8 illustrates an example of two spectral lines of two light sources according to a second embodiment.

FIG. 8 shows the spectral line of the first light source 310 and the spectral line of the second light source 320. These two spectral lines are injected into the spectral narrowing module 100. As in the first embodiment, the spectral narrowing module 100 comprises a first said at least one first coupler 111, a Brillouin resonator 120 and a modulator 130.

As previously mentioned, the first light source 210 and the second light source 220 are incident to the first said at least one first coupler 111. The two light sources can pump the resonator 120. As in the first embodiment, said at least one first coupler 111 derives the first pumping light beam 311 from the first incident light beam 310 originating from the first light source 210 and the second pumping light beam 321 from the second incident light beam 320 originating from the second light source 220.

Figure 9:
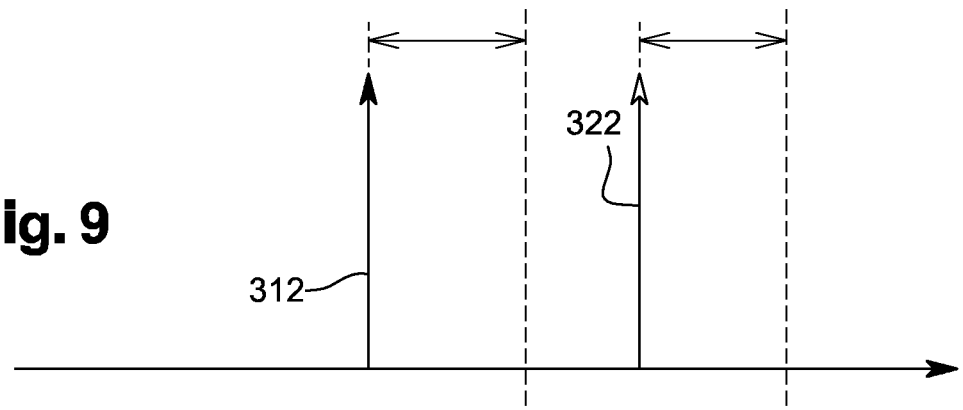
FIG. 9 shows an example of two resonant light beams according to a second embodiment.
Figure 10:
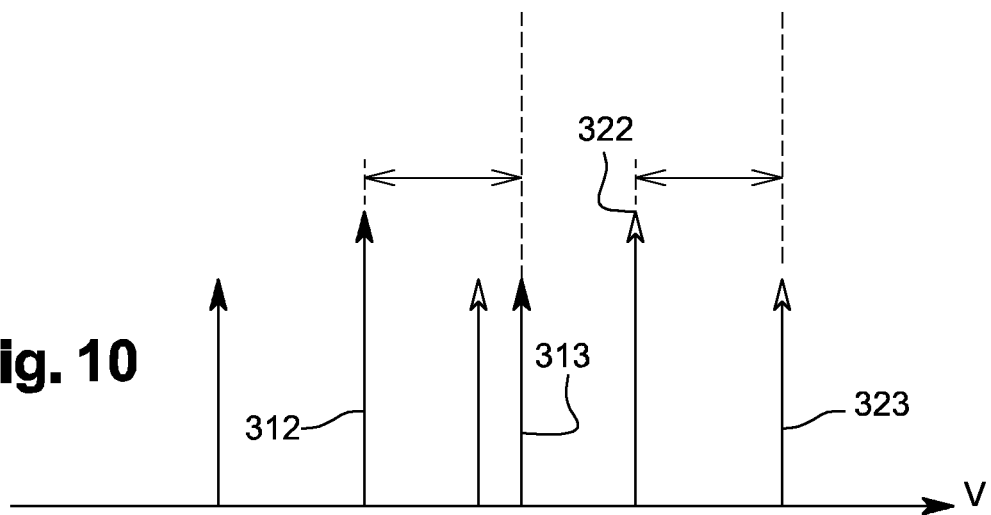
FIG. 10 shows an example of two modulated light beams according to a second embodiment.
Figure 11:
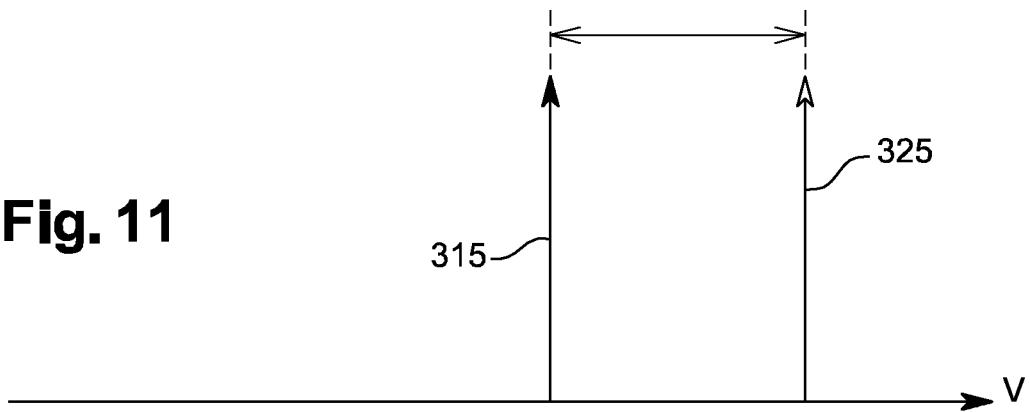
FIG. 11 shows an example of two spectral lines of two light sources according to a second embodiment.
Figure 12:
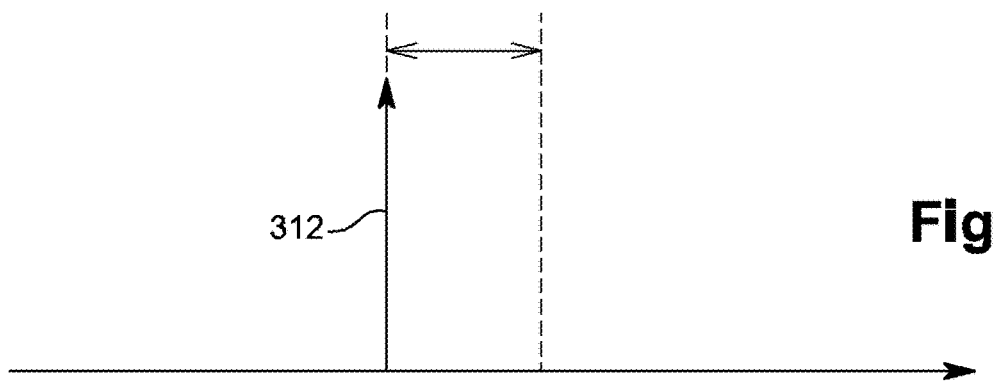
FIG. 12 shows an example of a resonant light beam 312 according to a third embodiment.
Figure 13:
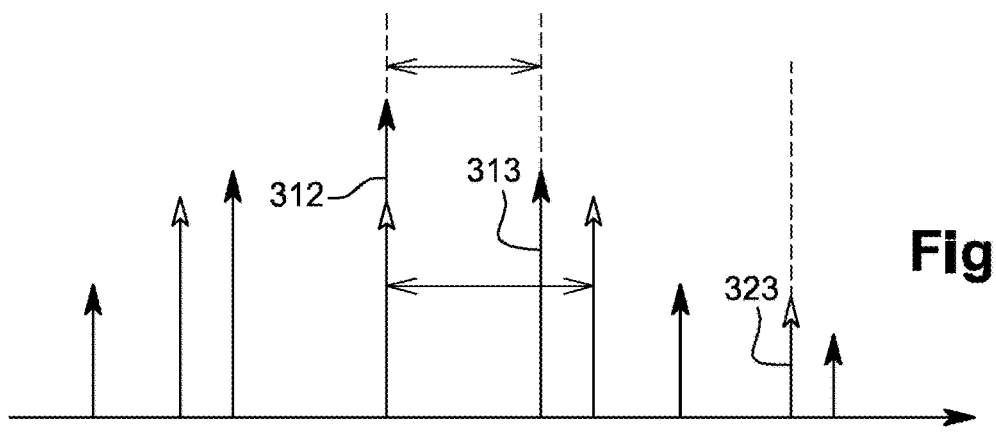
FIG. 13 illustrates an example of a modulated light beam at two modulation frequencies according to a third embodiment.
Figure 14:
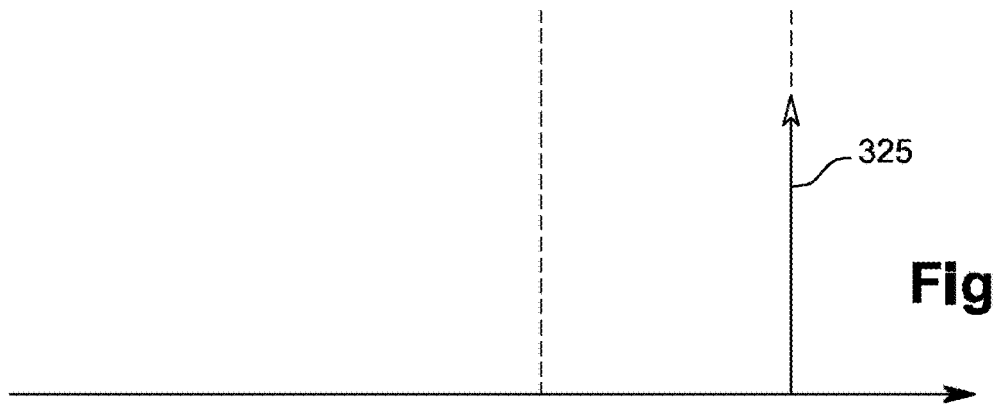
FIG. 14 shows an example of a spectral line of a light source according to a third embodiment.
Figure 15:
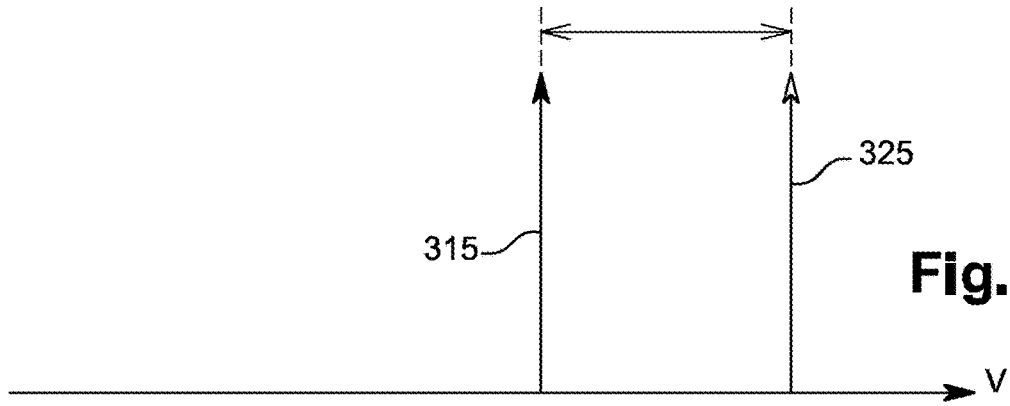
FIG. 15 shows the combination of the first light source and of the second light source according to the invention.

The resonator 120 generates a first resonant light beam 312 from the first pumping light beam 311 and a second resonant light beam 322 from the second pumping light beam 321. As in the first embodiment, the first resonant light beam 312 and the second resonant light beam 322 are frequency-shifted relative to the first incident light beam 310 and also relative to the second incident light beam 320. The first resonant light beam 312 and the second resonant light beam 322 are frequency-shifted from a few gigahertz to tens of gigahertz, as shown in FIG. 9. The first resonant light beam 312 and the second resonant light beam 322 are sent to the modulator 130.

The first resonant light beam 312 and the second resonant light beam 322 give rise to a first modulated light beam 313 and to a second modulated light beam 323 respectively.

The modulator 130 generates, from the first resonant light beam 312 and the second resonant light beam 322, at least one first modulated light beam 313 and one second modulated light beam 323. In practice, the first modulated light beam 313 and the second modulated light beam 323 may be with different harmonics.

The first light beam and the second light beam are totally or partially reintroduced into said at least one first coupler. Said at least one first coupler 111 totally or partially introduces the second modulated light beam 323 into the second light source 220 so as to narrow the spectral line of the second light source 220.

In this embodiment, it is also possible to provide that said at least one first coupler 111 totally or partially introduces the first modulated light beam 313 into the second light source 220 so as to narrow the spectral line of the second light source 220 if the characteristics of the spectral line of the first light source 210 allow it.

General Description of a Third Embodiment

Figure 4:
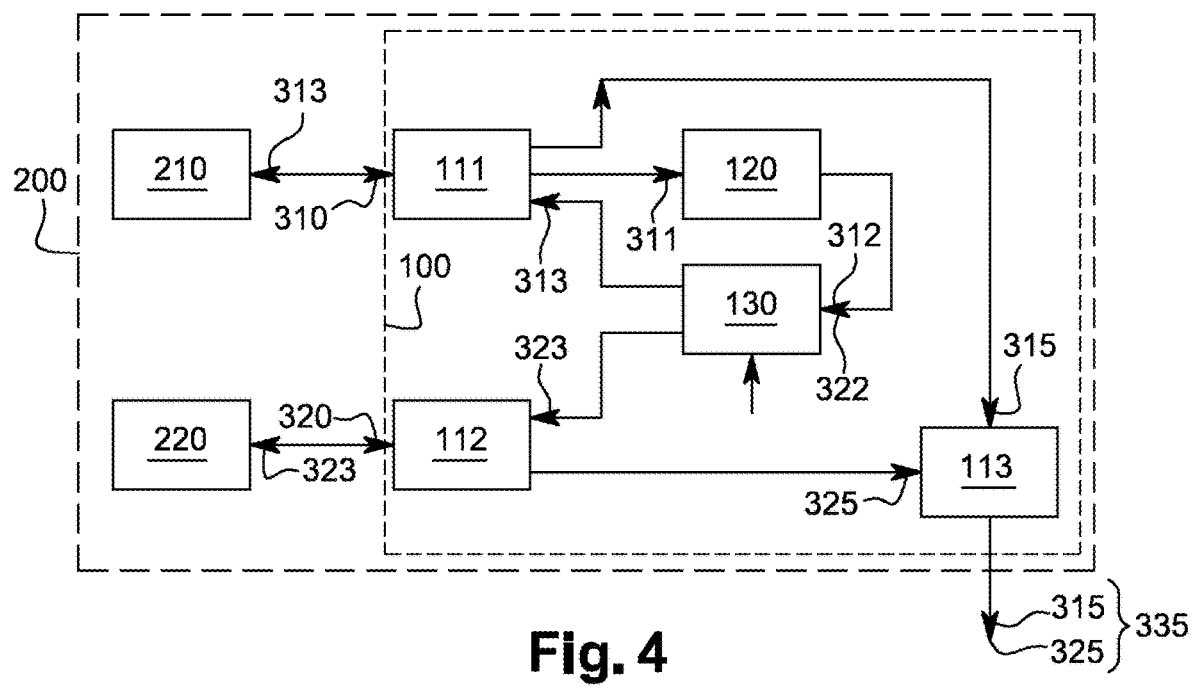
FIG. 4 shows an example of a refined spectral line device 200 and of a spectral narrowing module 100 comprising two light sources according to a non-limiting embodiment in which the method according to the invention is implemented.

In this third embodiment shown in FIG. 4, only the first light source 210 will be used to narrow the second light source 220. Indeed, in this configuration, the spectral narrowing module 100 comprises a first said at least one first coupler 111, a second said at least one first coupler 112, a third said at least one first coupler 113, a Brillouin resonator 120 and a modulator 130.

The first light source 210 emits a first light beam. The first said at least one first coupler 111 is configured to derive at least one first pumping light beam 311 from a first incident light beam 310 originating from said at least one first light source 210 and introduced into the spectral narrowing module 100. The first pumping light beam 311 is directed towards the Brillouin resonator 120.

This Brillouin resonator 120 is configured to generate, from at least one portion of said first pumping light beam 311, at least one first resonant light beam 312. The resonant light beam is frequency-shifted from a few gigahertz to a few tens of gigahertz, as shown in FIG. 6. This first resonant light beam 312 is sent to the modulator 130.

The modulator 130 is configured to generate, from the first resonant light beam 312, a first modulated light beam 313 and a second modulated light beam 323.

Indeed, from the first resonant light beam, the first resonant light beam 312 has different harmonics which correspond to the first incident light beam 310 and to the second incident light beam 320 respectively.

This embodiment allows refining the first light source 210 using the first modulated light beam 313 but also the second light source 220.

Indeed, the second light beam of the source is directed towards the second said at least one first coupler 112 in order to narrow the spectral line of the second light source 220.

The spectral line of the refined light beam is introduced into the second said at least one first coupler 112. This second said at least one first coupler 112 may derive a second signal light beam 325 from the second incident light beam 320 originating from the second light source 220.

The first refined light beam 315 and the second refined light beam 325 are introduced into the third coupler 113 in order to generate a third light beam comprising the spectral characteristics of the first signal beam 315 and the second signal light beam 325. The beat of the two beams, that is to say the first refined light beam 315 and the second refined light beam 325, allow having a third refined light beam at a lower frequency, that is to say in the Tera Hertz and/or Giga Hertz range.

Presentation of the Steps of the Method

The spectral line narrowing module but also the refined spectral line device 200 described above can operate according to a spectral narrowing method 500. This spectral narrowing method 500 can be used for at least one first light source 210 emitting a light beam. The spectral narrowing method 500 comprises a derivation 510 of a first incident light beam 310. The first incident beam 310 originating from at least one first light source 210 so as to generate a first light beam 320 called first pumping light beam 311.

This first pumping light beam 311 is introduced into a resonator 120 such that a resonance 520 of at least one portion of said first beam called first pumping light beam 311 occurs in the resonator 120. This resonance generates a first resonant light beam 312.

This first resonant light beam 312 is directed towards a modulator 130. It is in the modulator 130 that a modulation 530 is carried out. Effectively, a portion of said light beam called first resonant light beam is modulated so as to generate at least one first modulated light beam 313.

This modulated light beam 313, comprising at least one harmonic, allows a narrowing of the spectral line of the first light source 210 when, via a total or partial introduction of said first modulated light beam 313 into said at least one first light source 210 takes place by means of the first said at least one first coupler 111.

Very quickly, that is to say after two or three iterations, the first light source 210 is stabilized and refined. Thus, it is possible to derive, using the first aid at least one first coupler 111, a first signal light beam 315 whose spectral line is refined.

The feasibility and reproducibility of the spectral narrowing according to the invention have been demonstrated in the laboratory of the applicant.

In this demonstration, a continuous commercial DFB laser of Alcatel 1905 LMI type, whose wavelength peak is at 1550 nm, will be used as a light source in association with the spectral narrowing module 100 according to the invention. Of course, this association forms a refined spectral line device 200 according to the invention.

This light source emits a wave at the frequency $v_p$=1550 nm. The first light beam is incident to said at least one first coupler 111. A portion of this first incident light beam 310 is derived to generate at least one first pumping light beam 311. This light beam is introduced into a Brillouin resonator 120.

The Brillouin resonator 120, used in the demonstration, comprises an optical fiber forming a loop of more than one hundred meters in length and having the characteristic of being non-resonant for the laser-source, called pump laser-source 311.

The pumping light beam 311, generated from a portion of the incident light beam 310, performs a revolution in the resonator 120. However, the resonant light beam 312, generated from a portion of the pumping light beam 311, is resonant because the resonant light beam 312 propagates in the opposite direction of the pumping light beam 311 in this embodiment. Indeed, it is thanks to this characteristic that the resonant light beam 312 is extracted from the Brillouin resonator 120.

According to an embodiment not shown, the resonant light beam 312 may be copropagating with the pumping light beam 311. A coupler integrated into the Brillouin resonator 120 (not shown) allows sampling an optical power comprised between 1% and 50% as required. It is important to specify that the present invention operates and that regardless of the sampling rate of the optical power performed by the coupler integrated in the Brillouin resonator 120 (not shown).

Typically, for a pumping light beam 311 of 20 dBm, the power of the extracted resonant light beam 312 is of the range from 7 dBm to 12 dBm. The resonant light beam 312 emits a frequency $v_b$ which is frequency-shifted of $\Delta v=|v_p-v_b|\cong 11$ GHz, relative to the pumping light beam 312. The resonant light beam 312 thus generated has an excellent spectral fineness of a few tens of Hertz.

The resonant light beam 312 is then sent towards a modulator 130, in this case an intensity modulator 130. Conventionally, the modulators 130 are modulated by a synthesizer at the frequency $f_{OL}\cong\Delta v$. The first order harmonics at the frequencies $v_b\pm f_{OL}$ are thus generated.

This modulated light beam is then optically introduced into said at least one first light source. Spectrally refined and frequency-shifted, this modulated light beam allows both stabilizing the frequency and refining the line of said at least one first light source, in this case a laser source.

The beat $\Delta v$, observed using a photodiode, corresponds to the frequency deviation between the pumping light beam and the resonant light beam. The experimental spectrum of this beat $\Delta v=|v_p-v_b|\cong 11$ GHz is shown in FIG. 1.

Figure 1:
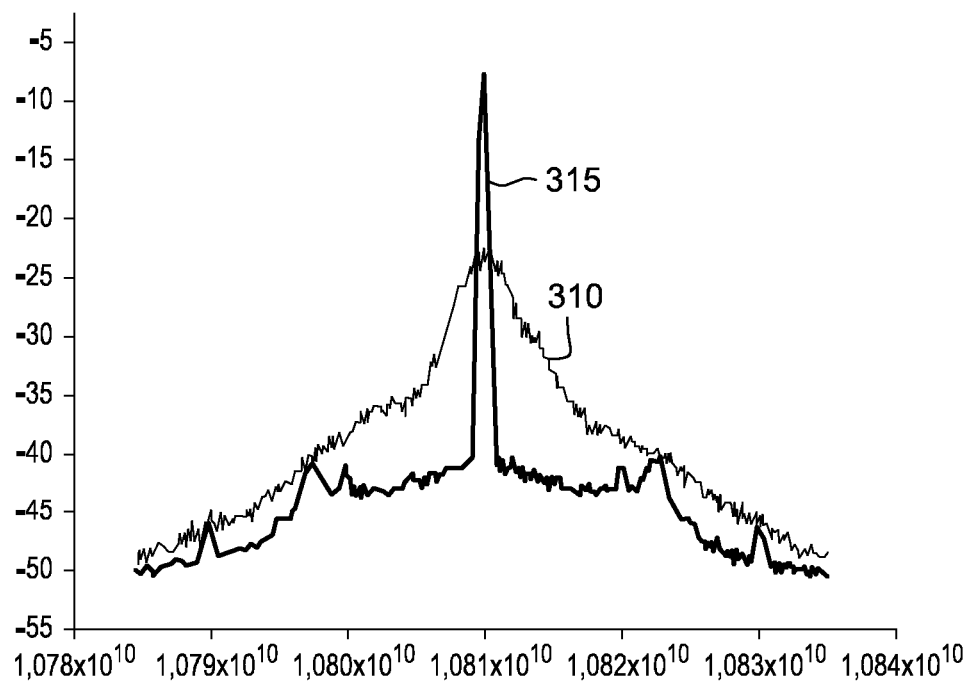
FIG. 1 shows an example of an ordinary spectral line and of a refined spectral line.

On this graph present in FIG. 1, the first incident light beam 310 and the first refined light beam are shown therein. The linewidth of the first incident light beam 310 is of the range of 2 MHz, whereas the linewidth of the first refined light beam has been considerably reduced when the first modulated light beam 313 is introduced into said at least one first light source 210.

When the spectral narrowing method 500 according to the invention is implemented in the second and third embodiment, the spectral narrowing method 500 has the advantage of refining the spectral lines of the first light source 210 and of the second light source 220 simultaneously.

Of course, by using the spectral narrowing method 500 according to a non-limiting embodiment, the second modulated light beam 323 is totally or partially introduced into a second light source 220 so as to narrow the spectral line of the second light source 220.

The invention claimed is:

1. A spectral narrowing module for at least one first light source, the spectral narrowing module comprising:
   at least one first coupler; said at least one first coupler is configured to derive at least one first pumping light beam from a first incident light beam originating from said at least one first light source and introduced into the spectral narrowing module;
   a Brillouin resonator; the Brillouin resonator is configured to generate, from at least one portion of said first pumping light beam, at least one first resonant light beam; and
   a modulator; the modulator is configured to generate, from the first resonant light beam, at least one first modulated light beam;
   the spectral narrowing module is configured to totally or partially introduce the first modulated light beam into said at least one first coupler, said at least one first coupler is configured to totally or partially introduce the first modulated light beam into said at least one first light source so as to narrow the spectral line of said at least one first light source.

2. The spectral narrowing module according to claim 1, wherein said at least one first coupler is configured to derive a first signal light beam from the first incident light beam originating from said at least one first light source and introduced into the spectral narrowing module.

3. The spectral narrowing module according to claim 1, wherein:
   said at least one first coupler is configured to derive at least one second pumping light beam from a second incident light beam originating from a second light source and introduced into the spectral narrowing module;
   the Brillouin resonator is configured to generate, from at least one portion of the second pumping light beam, a second resonant light beam; and
   the modulator is configured to generate, from the second resonant light beam, at least one second modulated light beam,
   the spectral narrowing module is configured to totally or partially introduce the second modulated light beam into said at least one first coupler, said at least one first coupler is configured to totally or partially introduce the second modulated light beam into the second light source so as to narrow the spectral line of the second light source.

4. The spectral narrowing module according to claim 3, wherein said at least one first coupler is configured to derive a second signal light beam from the second incident light beam originating from the second light source and introduced into the spectral narrowing module.

5. The spectral narrowing module according to claim 1, wherein the modulator is configured to generate, from the first resonant light beam (312), a second modulated light beam capable of refining the spectral line of a second light source.

6. The spectral narrowing module according to claim 5, which comprises a second coupler; the second coupler is configured to totally or partially introduce the second modulated light beam originating from the modulator into the second light source so as to narrow the spectral line of the second light source.

7. The spectral narrowing module according to claim 6, wherein the second coupler is configured to derive at least one second signal light beam from the second incident light beam originating from the second light source and introduced into the spectral narrowing module.

8. The spectral narrowing module according to claim 2, comprising a third coupler configured to generate, from at least one signal light beam among the first signal light beam originating from said at least one first coupler and the second signal light beam originating from the second coupler, a third signal light beam.

9. The spectral narrowing module according to claim 8, wherein the third signal light beam, totally or partially comprises at least one signal light beam among the first signal light beam of said at least one first light source and the second signal light beam of the second light source, the third signal light beam is generated by at least one coupler among said at least one first coupler and the third coupler.

10. A refined spectral line device comprising at least one spectral narrowing module according to claim 1 and at least one first light source associated to said at least one spectral narrowing module.

11. The refined spectral line device according to claim 10, which is configured to emit the first signal light beam.

12. A spectral narrowing method for at least one first light source emitting a first incident light beam, the spectral narrowing method comprising:

deriving of the first incident light beam originating from said at least one first light source so as to generate a light beam called first pumping light beam resonating at least one portion of said light beam called first pumping light beam with a Brillouin resonator so as to generate a first resonant light beam;

modulating at least one portion of the first resonant light beam so as to generate at least one first modulated light beam; and introducing a portion or all of said at least one first modulated light beam into said at least one first light source.

13. The spectral narrowing method according to claim 12, wherein during the modulating step, at least one portion of the first resonant light beam is modulated so as to generate a second modulated light beam.

14. The spectral narrowing method according to claim 13, wherein, during the introducing step, the second modulated light beam is totally or partially introduced into a second light source so as to narrow the spectral line of the second light source.

15. The spectral narrowing method according to claim 12 using the spectral narrowing module according to claim 1.

16. The spectral narrowing method according to claim 12 using the refined spectral line device according to claim 10.

17. The spectral narrowing module according to claim 2, wherein:

said at least one first coupler is configured to derive at least one second pumping light beam from a second incident light beam originating from a second light source and introduced into the spectral narrowing module;

the Brillouin resonator is configured to generate, from at least one portion of the second pumping light beam, a second resonant light beam; and the modulator is configured to generate, from the second resonant light beam, at least one second modulated light beam, the spectral narrowing module is configured to totally or partially introduce the second modulated light beam into said at least one first coupler, said at least one first coupler is configured to totally or partially introduce the second modulated light beam into the second light source so as to narrow the spectral line of the second light source.

18. The spectral narrowing module according to claim 17, wherein said at least one first coupler is configured to derive a second signal light beam from the second incident light beam originating from the second light source and introduced into the spectral narrowing module.

19. The spectral narrowing module according to claim 2, wherein the modulator is configured to generate, from the first resonant light beam (312), a second modulated light beam capable of refining the spectral line of a second light source.

20. The spectral narrowing module according to claim 19, which comprises a second coupler; the second coupler is configured to totally or partially introduce the second modulated light beam originating from the modulator into the second light source so as to narrow the spectral line of the second light source.

* * * * *